United States Patent [19]

Okamoto et al.

[11] Patent Number: 5,362,551
[45] Date of Patent: Nov. 8, 1994

[54] CERAMIC SUBSTRATE

[75] Inventors: Naoyuki Okamoto; Hidetoshi Mizutani; Kazunori Miura; Kazuo Kondo, all of Aichi, Japan

[73] Assignee: NGK Spark Plug Co., Ltd., Aichi, Japan

[21] Appl. No.: 189,284

[22] Filed: Jan. 31, 1994

Related U.S. Application Data

[63] Continuation of Ser. No. 885,362, May 19, 1992, abandoned.

[30] Foreign Application Priority Data

May 22, 1991 [JP] Japan .................................. 3-146843
Mar. 18, 1992 [JP] Japan .................................. 4-92239

[51] Int. Cl.⁵ ............................................. B32B 9/00
[52] U.S. Cl. .................................... 428/210; 174/257; 174/264
[58] Field of Search ................ 428/210; 174/257, 264

[56] References Cited

U.S. PATENT DOCUMENTS

| | | | |
|---|---|---|---|
| 4,490,429 | 12/1984 | Tosaki et al. | 428/195 |
| 4,795,670 | 1/1989 | Nishigaki et al. | 428/209 |
| 5,029,242 | 7/1991 | Sammet | 174/257 |

FOREIGN PATENT DOCUMENTS

| | | |
|---|---|---|
| 396806 | 11/1990 | European Pat. Off. |
| 59-92943 | 5/1984 | Japan |
| 1286494 | 11/1989 | Japan |
| 319295 | 1/1991 | Japan |

Primary Examiner—Patrick J. Ryan
Assistant Examiner—Kam F. Lee
Attorney, Agent, or Firm—Sughrue, Mion, Zinn, Macpeak & Seas

[57] ABSTRACT

A ceramic substrate is described consisting essentially of a crystallized glass and having at least one throught-hole filled with a conductor material having 100 parts by weight of copper and form 1 to 30 parts by weight of a glass having a softening point of 1,000° C. or less and a thermal expansion coefficient of from $1.5 \times 10^{-6}$/K to $4.0 \times 10^{-6}$/K as measured in a temperature range of from room temperature to 400° C.

4 Claims, No Drawings

CERAMIC SUBSTRATE

This is a continuation of application Ser. No. 07/885,362 filed May 19, 1992, now abandoned.

FIELD OF THE INVENTION

The present invention relates to a ceramic substrate having at least one through-hole filled with a conductor material. The substrate can be produced through low-temperature calcination and is suited for use as a substrate for high-density multilayered circuit boards, IC (integrated circuit) packages, and the like.

BACKGROUND OF THE INVENTION

Copper is useful as a conductor material for circuit substrates intended for high density or signal propagation rate increase, because of its low cost and low resistivity and because the use of copper is free from the problem of short-circuiting or other troubles attributable to heat dissipation within the ceramic substrates that are insulating materials. In the case of using copper as a conductor material in combination with an insulating ceramic to fabricate a circuit substrate, a so-called low-temperature calcination ceramic which can be calcined at temperatures around 1,000° C., such as a crystallized glass, glass-ceramic, or the like, should be used as the insulating material because of the melting point of copper.

However, since the thermal expansion coefficients of known low-temperature calcination ceramics, which range from about $1.5 \times 10^{-6}$/K to about $7.0 \times 10^{-6}$/K, differ greatly from that of copper, which is $17 \times 10^{-6}$/K, simultaneous calcination of copper and a low-temperature calcination ceramic has had the following problem. That is, even if the two materials are bonded with each other during calcination, they may separate from each other during subsequent cooling due to a difference in contraction, thereby forming a gap or crack.

As an expedient for overcoming the above problem, a technique has been proposed in which a conductor material consisting of from 95 to 98.5% by weight of conductor particles of a low-expansion material, such as WC, VC, or the like, and from 1.5 to 5% by weight of a glass is used to fill those parts of through-holes which are near the substrate surface (JP-A-3-19295, which corresponds to U.S. Pat. No. 5,029,242). (The term "JP-A" as used herein means an "unexamined published Japanese patent application".)

The above technique disclosed in JP-A-3-19295, however, has a drawback in that it is troublesome that the parts of the through-holes near the substrate surface and the inner parts of the through-holes must be filled with different conductor materials. However, if all parts of each through-hole in a substrate are filled only with the above-described conductor material, too high a resistivity results.

The prior art, JP-A-3-19295, proposes to maintain an air-tight seal in glass ceramics with a use of a conductor material comprising a metals or metal carbides of, such as W, Mo, Ti, etc., and a glass, in order to overcome above drawbacks. According to the Examples of said prior art, a multi-layered substrate is sealed with an upper-most and lower-most layers which contain specific metals or metal carbides, whereas the intermediate layers are composed of the prior known substrates having through holes filled with a conductor material containing copper powder.

The specific metal or metal carbide powder of JP-A-3-19295 is required to have a thermal expansion having little higher than of the glass ceramics of about $3.0 \times 10^{-6}$/K, however, the thermal expansion of copper which is used in the present invention shows about $17.0 \times 10^{-6}$/K.

The thermal expansion coefficient of these materials are as follows.

| | |
|---|---|
| Glass-ceramics | 3.0 ($\times 10^{-6}$/K) |
| WC | 3.84 |
| TiC | 7.74 |
| VC | 7.2 |
| TaC | 6.29 |
| Mo | 5.1 |
| W | 4.5 |
| Cu | 17.0 |

Further, the use of copper as a through-hole-filling material is disclosed, for example, in JP-A-1-2864942, and has had the following problem. The conductor material for use in this application usually contains organic components, e.g., a resin, in order to enable filling the through-holes with the conductor material, and after completing the through-hole filling, the substrate is heated in the air to remove the organic components. This heating, however, causes the copper to be oxidized and thus to expand, resulting in generation of cracks in and around the through-hole conductor. In some cases, it is required to repare the cracks with a polymer, such as polyimide.

SUMMARY OF THE INVENTION

An object of the present invention is to provide a ceramic substrate which is free from cracks, while taking advantage of copper, and which can be produced by a simple process.

Other objects and effects of the present invention will be apparent from the following description.

The present invention provides a ceramic substrate consisting essentially of crystallized glass and having at least one through-hole filled with a conductor material comprising 100 parts by weight of copper and from 1 to 30 parts by weight of a glass having and a softening point of 1,000° C. or less and a thermal expansion coefficient of from about $1.5 \times 10^{-6}$/K to about $4.0 \times 10^{-6}$/K as measured in a temperature range of from room temperature to 400° C.

DETAILED DESCRIPTION OF THE INVENTION

The crystallized glass according to the present invention comprises a cordierite as a main crystal and a crystal phase which is considered as a β-quartz solid solution and shows a low dielectric constant, such as $\epsilon = 5.0$, and a low thermal expansion coefficient, such as $\alpha = 3.0 \times 10^{-6}$/K. A composition of the crystallized glass is as follows.

| | |
|---|---|
| $SiO_2$ | 57–63% by weight |
| $Al_2O_3$ | 20–28 |
| MgO | 10–18 |
| ZnO | 2–6 |
| $B_2O_3$ and/or $P_2O_5$ | 0.1–6 |

The conductor material which includes a crystallized glass according to the present invention are composed of from 40 to 52% by weight of $SiO_2$, from 27 to 37% by weight of $Al_2O_3$, from 11 to 13% by weight of MgO, from 2 to 8% by weight of $B_2O_3$, from 2 to 8% by weight of CaO, and from 0.1 to 3% by weight of $ZrO_2$, as shown in JP-A-59-92943.

Due to the incorporation of a glass, the conductor material filling the through-hole has a reduced Cu content and, thus, the expansion thereof by oxidation is reduced, so cracking can be prevented.

Although the thermal expansion coefficients of Cu and the crystallized glass substrate are $17 \times 10^{-6}/K$ and about $3 \times 10^{-6}/K$, respectively, which differ considerably from each other, the difference in the thermal expansion coefficient between the conductor and the substrate is reduced greatly by the incorporation into the Cu of the glass having a thermal expansion coefficient of from about $1.5 \times 10^{-6}/K$ to about $4 \times 10^{-6}/K$. Therefore, the conductor comes to have reduced residual stresses and, as a result, the occurrence of cracks in the substrate and conductor parts can be prevented.

Further, since heating in the air does not cause oxidation of the glass even though the copper is oxidized, the expansion of the conductor material as a whole due to heating in the air is reduced by an amount corresponding to the incorporated glass.

Another advantage of the ceramic substrate of the present invention is as follows. Because the glass incorporated in the conductor has a softening point of 1,000° C. or less, calcination of the substrate at a temperature of 1,000° C. is sufficient to soften the glass and allow the softened glass to wet the wall of the through-hole in the substrate. As a result, the bonding strength at the interface between the substrate and the conductor is increased and the airtightness of the through-hole can be improved.

The reason for the range of from 1 to 30 parts by weight for the amount of incorporated glass is that incorporated glass amounts exceeding 30 parts result in too high an electrical resistivity of the conductor. The preferred range of the glass amount may be from 1 to 15 parts from the standpoint of electrical conductivity.

A multilayered ceramic substrate is explained below as one embodiment of the present invention. This ceramic substrate is manufactured by the following sequence of steps.

Green Sheet Production Step

As raw materials for a green sheet, predetermined amounts of ZnO, $MgCO_3$, $Al(OH)_3$, $SiO_2$, $H_3BO_3$, and $H_3PO_4$ for forming the crystal glass above, are weighed, mixed by means of a crusher, and then melted in a platinum crucible at an adequate temperature between 1,400° and 1,500° C. This molten composition is quenched by being poured into water, and then vitrified. The resulting glass is pulverized with a ball mill made of alumina, thereby preparing a frit (glass powder) having particle diameters of from 2 to 3 μm.

Using this powder along with an organic solvent and a plasticizer, a plurality of green sheets are formed by the ordinary doctor blade method.

Punching Step

Each of the thus-formed green sheets is punched to form through-holes at predetermined positions.

Conductor Paste Filling and Printing

The through-holes in each green sheet are filled with a Cu-based conductor composition paste (conductor paste) by filling press, the formulation for which is shown below. (In some cases, a conductor layer is formed on the green sheet surface by screen printing.)

Although various formulations and raw material particle diameters may be used for preparing the conductor paste, one exemplary formulation is as follows.

|  | Weight | Average Particle size |
|---|---|---|
| Cu | 100 parts | 4.0 μm |
| Glass | 1–30 parts | 1.0 μm–3.0 μm |
| Resin (binder) | 10–20 parts | |
| Solvent | adequate amount | |

The conductor paste may be prepared by steps which comprise first mixing a mixture comprising Cu powder, solvent of diethylene glycol mono-n-butyl ether acetate, dispersant and acetone, for 10 hours, and second mixing a mixture comprising the products of the first mixing, binder resin, plasticizer and acetone, for 2 hours.

Laminating Step

The thus-treated green sheets are stacked in a predetermined order and united into a laminate by application of heat and pressure. This laminate is cut to a predetermined size and trimmed. Although green sheets prepared beforehand are laminated in this process, it is also possible to form superposed insulating layers one after another by printing.

Binder Elimination Step

The laminate is then subjected to preliminary calcination in the air at about 300° C. to eliminate the organic components, including the resin, contained in the green sheets and conductor layers. Thereafter, the laminate is calcined in the air at 700° C., upon which the residual carbon disappears.

Reductive Calcination Step

The resultant laminate is kept at 500° C. in an atmosphere of decomposed ammonia gas, whereby CuO is reduced to Cu. In this calcination, hydrogen gas may be used in place of the decomposed ammonia gas.

Main Calcination Step

Main calcination is then conducted at 1,000° C. for 1 hour in a neutral atmosphere such as nitrogen gas. By this calcination, the conductor is united with the ceramic.

As described above, in this embodiment, the Cu-based conductor composition for the ceramic substrate contains an adequate amount of a low-expansion glass as one component thereof. Due to this, the expansion of Cu by oxidation is buffered, and the difference in the thermal expansion coefficient between the Cu conductor and the substrate is reduced. Therefore, the development of cracks in the conductor layers and the substrate can be prevented, cracks and the conductive layers can show good electrical conduction and have a high degree of airtightness.

Accordingly, the ceramic substrate of the present invention can attain both a low conductor resistivity and excellent airtightness.

The present invention is illustrated below with reference to the following example, which was conducted in order to demonstrate the effects of the invention. However, the present invention is not to be construed as being limited thereto. Unless otherwise indicated, all parts, percents, ratios and the like are by weight.

EXAMPLE

Ceramic substrates having a conductor layer (Cu via) were produced through the steps as described above.

(Each of the substrates produced had dimensions of 20 mm by 20 mm by 1 mm and 600 through-holes, with the hole diameter being 0.1 mm and the hole pitch being 0.700 mm.) The glass incorporated in the conductor material was a crystallized glass composed of 8% CaO, 31% $Al_2O_3$, 41% $SiO_2$, 11% MgO, 8% $B_2O_3$, and 1% $ZrO_2$ by weigh and having a thermal expansion coefficient of $3.0 \times 10^{-6}$/K and a softening point of 942° C. Each substrate was examined for the specific resistance and airtightness of the through-hole conductor, cracking in the substrate, and gapping between the via and substrate. The results obtained are summarized in Table 1.

With respect to airtightness, samples showing airtightness values of $10^{-8}$ std.cc/sec or less according to MIL-STD-883 1014 (He leak test) are indicated by ◯, and those showing larger airtightness values are indicated by x.

With respect to cracking, samples containing continuously extending cracks having widths of around 10 μm are indicated by x, those partly having such a crack are indicating by Δ, and those having almost no crack are indicated by ◯.

Examination for a gap between the through-hole conductor and the substrate was conducted by examining a section of the substrate with a scanning electron microscope (SEM). Samples having a significant gap are indicated by x, while those having almost no gap are indicated by ◯. For the purpose of comparison, a glass-free conductor was also used to produce a comparative ceramic substrate.

TABLE 1

| No. | Glass amount (parts by weight) | Specific resistance (μΩ · cm) | Airtight-ness | Cracking | Gapping between conductor and substrate |
|---|---|---|---|---|---|
| 1R | 0 | 2.5 | x | x | x |
| 2 | 2.5 | 2.5 | ◯ | Δ | ◯ |
| 3 | 5 | 2.6 | ◯ | Δ | ◯ |
| 4 | 7.5 | 2.8 | ◯ | ◯ | ◯ |
| 5 | 15 | 5.5 | ◯ | ◯ | ◯ |
| 6 | 30 | 11.2 | ◯ | ◯ | ◯ |
| 7R | 50 | 98.4 | ◯ | ◯ | ◯ |

It is apparent from Table 1 that airtightness, cracking, and gapping between via and the substrate were improved by the incorporation of a glass into the conductor material, and that the specific resistance was kept almost constant in the glass amount range up to 7.5 parts. In contrast, the comparative sample employing a glass-free conductor was defective in that it showed impaired airtightness, developed considerable cracks, and formed a gap between the via and the substrate.

Since a glass amount of 50 parts by weight results in too high a specific resistance of the conductor, the incorporated glass amount preferably is not larger than 30 parts by weight. A specific resistance of the conductor is preferably 5 μm.cm or lower, which is for lower than 5.7 or 5.5 of the specific resistance in molybudenum metal or tungusten metal, which is widely used in a conductor paste for aluminum substrate.

As demonstrated above, the ceramic substrate of the present invention is free from cracking and can have high electrical conductivity and airtightness, because a conductor composition containing a predetermined amount of a low-thermal-expansion glass as one component thereof was used for through-hole filling in producing the ceramic substrate.

While the invention has been described in detail and with reference to specific embodiments thereof, it will be apparent to one skilled in the art that various changes and modifications can be made therein without departing from the spirit and scope thereof.

What is claimed is:

1. A ceramic substrate consisting essentially of a crystallized glass and having at least one through-hole filled with a conductor material consisting essentially of 100 parts by weight of copper and from 1 to 30 parts by weight of a glass which softens when the substrate is subjected to calcination at a temperature of 1,000° C. and which has a thermal expansion coefficient of from $1.5 \times 10^{-6}$/K to $4.0 \times 10^{-6}$/K as measured in a temperature range of from room temperature to 400° C.

2. A ceramic substrate as claimed in claim 1, wherein the glass contained in the conductor material is a crystallized glass comprising from 40 to 52% by weight of $SiO_2$, from 27 to 37% by weight of $Al_2O_3$, from 11 to 13% by weight of MgO, from 2 to 8% by weight of $B_2O_3$, from 2 to 8% by weight of CaO, and from 0.1 to 3% by weight of $ZrO_2$.

3. A ceramic substrate as claimed in claim 1, wherein the conductor material consists essentially of 100 parts by weight of copper and from 1 to 15 parts by weight of a glass which softens when the substrate is subjected to calcination at a temperature of 1,000° C. and which has a thermal expansion coefficient of from $1.5 \times 10^{-6}$/K to $4.0 \times 10^{-6}$/K as measured in a temperature range of from room temperature to 400° C.

4. A ceramic substrate as claimed in claim 1, wherein the substrate is multilayered.

* * * * *